United States Patent [19]

Bis

[11] Patent Number: 5,094,837
[45] Date of Patent: Mar. 10, 1992

[54] METHOD FOR USE OF MAGNETIC RESONANCE IMAGING TO IMAGE PANCREAS USING SECRETIN

[75] Inventor: Kostaki G. Bis, Troy, Mich.

[73] Assignee: Wayne State University, Detroit, Mich.

[21] Appl. No.: 467,995

[22] Filed: Jan. 22, 1990

[51] Int. Cl.$^5$ .................... G01N 31/00; A61B 5/50
[52] U.S. Cl. .......................... 424/9; 128/654; 128/653.4; 436/806; 436/173
[58] Field of Search ................ 128/654, 898, 653; 424/4, 9; 436/806, 173

[56] References Cited

PUBLICATIONS

Schneider et al., NMR Spectrometric Stool Fat Analysis—A New Technique for Quantifying Steatorrhea and Establishing the Indication for Enzyme Replacement in Chronic Pancreatitis; Hepato-gastroenterol (1985), pp. 210–215.

Puolakkainen et al., Magnetic Resonance Imaging in Detecting Acute Oedematous and Haemorrhagic Pancreatitis: An Experimental Study in Pigs, 1989, Eur. Surg. Res., pp. 25–33.

Schneider et al., NMR Spectrometry, A New Method for Total Stool Fat Quantification in Chronic Pancreatitis, Digestive Diseases and Sciences (May 1987), pp. 494–499.

Mutt, V.: "Vasoactive Intestinal Polypeptide and Related Peptides"; *Isolation and Chemistry Annals of the New York Academy of Sciences*, 527, pp. 1–19; 1988.

Christope, J. et al: "Vasoactive Intestinal Peptide Receptors in Pancreas and Liver Structure—Function Relationship"; *Annals of the New York Academy of Sciences*, 527, pp. 238–256; 1988.

Van Dyke, J. et al: "Pancreatic Imaging"; *Annals of Internal Medicine, 102, pp. 212–217; 1985.*

Niederau, C. et al: "Diagnosis of Chronic Pancreatitis"; *Gastroenterology*, 88, pp. 1973–1995; 1985.

Carlquist, M. et al: "Isolation and Amino Acid Sequence of Bovine Secretin"; *FEBS Letters*, 127, No. 1, pp. 71–74; 1981.

Bis, K. G. et al: "Clinical Applications of Magnetic Resonance (MR) Contrast Agents"; ACS, University of Kansas; Nov. 6, 1989.

*Primary Examiner*—C. Fred Rosenbaum
*Assistant Examiner*—Mark O. Polutta
*Attorney, Agent, or Firm*—Gifford, Groh, Sprinkle, Patmore and Anderson

[57] ABSTRACT

Structural and functional imaging of the pancreas can be achieved with magnetic resonance imaging and a secretin solution. An amount of secretin is placed in solution and administered to a patient for the purpose of pancreatic imaging. Because the secretin solution changes the signal intensity of the pancreas, it can be imaged relative to baseline fasting studies for the purposes of tumor detection and qualification of exocrine dysfunction.

3 Claims, 3 Drawing Sheets

METHOD FOR USE OF MAGNETIC RESONANCE IMAGING TO IMAGE PANCREAS USING SECRETIN

BACKGROUND OF THE INVENTION

I. Field of the Invention

The field of this invention is that of contrast agents for magnetic resonance imaging (MRI) for pancreatic imaging. This invention relates to a non-invasive method of magnetic resonance imaging (MRI) of the pancreas using a secretin solution and a kit for use in such imaging.

II. Description of the Related Art

Diagnostic methods currently used for evaluating the pancreas include computed tomography, ultrasound, angiography, and endoscopic retrograde cholangiopancreatography. For the most part, these methods. Only provide anatomical information.

Heretofore, the evaluation of pancreatic exocrine function relied on several biochemical analyses. Among these, exogenous hormonal stimulation with secretin, alone, or in combination with cholecystokinin (CCK), is the standard test for measuring pancreatic exocrine function. Secretin is a naturally occurring heptacosapeptide. It has advantages as a diagnostic agent since it is commercially available and free of adverse reactions. The use of secretin as a diagnostic agent, therefore, is currently limited to evaluating pancreatic exocrine function. However, this is an invasive and technically difficult examination requiring gastric and duodenal intubation.

Magnetic resonance imaging (MRI) is known as a cross-sectional imaging modality for diagnosing various conditions in a patient. Because of the non-invasive nature and unique features of MRI, it would be useful to develop a technique which could investigate the pancreatic architecture and exocrine function simultaneously.

SUMMARY OF THE PRESENT INVENTION

Accordingly, the present invention consists of a contrast agent for use in magnetic resonance imaging of pancreas using a secretin solution. A secretin solution is administered to the patient by intravenous infusion for imaging of the pancreas.

Secretin is used as a diagnostic tool which is commercially available from Ferring Laboratories, Inc., Suffern, N.Y. The secretin can be extracted from porcine or bovine sources, or can be genetically recombined porcine, bovine or human secretin.

The physiological response of the pancreas to secretin and CCK is well known. Secretin stimulates the pancreatic duct epithelial cells and centroacinar cells to secrete fluid and bicarbonate and its effects are potentiated by acetyl choline and CCK. CCK stimulates the pancreatic acinar cells to excrete the enzymes required for digestion such as lipases, amylases and trypsin. The secretin, CCK and cholinergic muscurinic receptors are located at the cell surface membrane and potentiation occurs though various intracellular second messengers. With secretin stimulation in the normal individual, both blood flow and fluid secretion are increased with the secretory rates being as high as 300 cc/80 minutes in response to 1-CU/kg. The state of hydration of the pancreas therefore changes, and large amounts of water are moved from an intracellular to an extracellular environment leading to distention of pancreatic radicals.

Because of the dipole-dipole coupling with proteins and other macromolecules, the intracellular water in any organ is known to have shorter $T_1$ and $T_2$ relaxation values. In response to secretin, the large amounts of extracellular water in the macro- and microscopic pancreatic ductules may be looked at as being more bulk-like and, therefore will have longer $T_1$ and $T_2$ relaxation times. As such, pancreatic signal intensity changes in response to secretin stimulation with or without additional pharmacological manipulations.

Therefore, secretin can be suspended in a biological carrier and administered by intravenous injection to be used as an MRI diagnostic agent with or without concomitant administration of additional known potentiating substances. Then, magnetic resonance imaging ca be used to detect changes in pancreatic signal intensity. Such changes may be quantified for diagnosis of pancreatic exocrine dysfunction. In addition, it is expected that the contrast between the normal pancreatic tissue and any mass involving it will increase resulting in enhanced detection of inflammatory and neoplastic masses of the pancreas.

DETAILED DESCRIPTION OF THE PREFERRED EMBODIMENT EXPERIMENTAL

Figure 1:
FIG. 1 is a magnified $T_2^*$-weighted FLASH image showing portions of the head and neck of the pancreas outlined for SI measurement. The gall bladder (G), left hepatic lobe (H), kidney (K) and superior mesenteric vein (V) are also seen at this level.

The method of this invention was tested on an experimental basis using porcine secretin and various MRI sequences. This study demonstrated the feasibility of performing single breath Fast Low Angle Shot (FLASH) MRI of the pancreas using a surface coil which yields exquisite detail of the pancreas. Such a rapid imaging mode is one among many techniques which is required for studying the physiologic response of the pancreas to secretin stimulation.

A. Preparation

Commercially available porcine secretin was purchased from Ferring Laboratories and reconstituted to a concentration of 10 clinical units per 1 ml of Normal saline. This mixture was administered intravenously over 1-minute to patients at 2 clinical units per kilogram body weight.

B. Subjects and Materials

Seven volunteers (ages 26-34) fasted for at least 10-12 hours prior to scanning. They had no history of alcohol abuse or medical problems related to the pancreas. Glucagon and oral contrast agents were not administered. Secretin was used as the purified porcine peptide.

C. MRI Technique

MRI imaging was performed with the Siemens 1.0 T Magnetom. In three of the seven subjects, spin echo (SE) images were generated utilizing a body coil. FLASH images were generated using a round 19cm. Helmholtz surface coil in six of the seven volunteers.

Dual spin echo (SE) pulse sequences having repetition time (TR) to echo delay time (TE) ratios (TR/TE in msecs/msecs of $600/30$, $2500/30$ and $2500/80$ were applied using 4-acquisitions (aq's) for $T_1$-weighted and 2-aq's for $T_2$-weighted scans. The zoom factor (zf) was 1.3 and the section thickness was 8-mm with a 50% gap. A matrix of 256×256 pixels was used. The $T_1$-and $T_2$-weighted SE images of the entire pancreas required 10 and 20 min's, respectively, following the SE coronal scouts, (TR=300-msec's, TE=17-msec's, aq's=1, section thickness=10-mm, matrix=256 extended, zf=1.3, and gap=50%). Scanning was performed in the supine position and shallow breathing was assisted with up to 5-1 of 02 via nasal canula, n.c.

FLASH MRI scanning was performed in the prone position using the Helmholtz surface coil with the epigastric region slightly above the center of the surface coil receiver. Following initial coronal scouts, the approximate pancreatic region was flagged and FLASH $T_1$-weighted transaxial scouts were obtained to better localize the pancreatic bed (TR=300-msec's, TE=11-msec's, aq's=2, flip angle=40 and gap=50%). These required 2.8 min's. while shallow breathing with 10-1 02 via n.c.

Following pancreatic localization, an initial slice position which was 2-3 slice positions below the region of interest (body or head of pancreas) was used for initiating the FLASH sequences. A zf of 1.3, section thickness of 7-mm with a 50% gap and a 256×256 matrix were used for all FLASH scans. The perameters are set forth in Table 1 as follows:

TABLE 1

| | TR msecs | TE msecs | Flip angle | (N) | Scan time (seconds) | # of sections |
|---|---|---|---|---|---|---|
| $T_1$- weighted Flash | 30 | 11 | 40° | 4 | 36 | 1 |
| $T_2$°- weighted FLASH | 150 | 30 | 10° | 2 | 78 | 3 |

All FLASH sequences were initiated following suspension of respiration after a large inspiratory volume. No one had any difficulties in holding their breath even for the scan time of 78 sec's in that an adequate time (15 sec's) was allowed for hyperventilation with $O_2$. Commands were given over an intercom. As a control, five volunteers who were given secretin at 2-CU/kg were imaged on a later date using $T_2$*-weighted FLASH sequences both before and after bolus injection of normal saline.

D. Injection Technique and Timing of Sequences

Following preliminary $T_1$-and $T_2$-weighted SE and-/or FLASH scans, the volunteers remained in the magnet and secretin was injected as a bolus via a forearm i.v. catheter. Injection was made directly into a side port attached to the angiocath. In two subjects, $T_1$-and $T_2$-weighted SE sequences were performed prior to and following bolus injection of secretin at 1-CU/kg. In that the $T_2$-weighted images were of poor quality and resolution and that no significant change in SI of the pancreas was seen, SE pulse sequences were abandoned and only FLASH MRI was performed.

Secretin (2-CU/kg) was administered i.v. as a bolus over 1-min to six volunteers and $T_2$*-weighted FLASH MR was initiated immediately following the bolus termination (time 0), and subsequently at 5, 7, 12, and 20 min's post injection; one set of three sections of the pancreas was obtained at each time interval to include the pancreatic body, neck and head. In five of these six volunteers, $T_1$-weighted FLASH sequences were performed during the injection (initiated 15-20 sec's into the injection) and subsequently at 3, 10, and 15 min's post injection: only one section (pancreatic head) was obtained at each time interval.

E. Signal Intensity Measurement

Signal intensity values of either the head or neck and body of the pancreas were measured following magnification of a given image and drawing out the region of interest free hand (FIG. 1). These were divided by the signal intensities (SI) of standards such as the right psoas or paravertebral muscles. The percent change of relative signal intensity (SI) at various time intervals was calculated along with standard deviations. Statistical calculations were made with computer assisted multivaried analysis of variants. The regions of interest were at least 400 pixels. Drawing the entire region of interest free hand included most of the organ in any given slice position and this eliminated any bias given the fact that there is slight SI heterogeneity within the tissue. Only those images which correlated anatomically to the same section level were used for measurements of SI. This is important given the variation of SI of different parts of an organ due to differences in their distances from the center of the surface coil in either the radial and/or anterior-posterior dimension.

F. RESULTS

Preliminary Scans

On the $T_2$-weighted scans, $T_2$-weighting was better with SE sequences, however, resolution was obviously better using single breath FLASH imaging. It was extremely difficult to consistently image the body and tail of the pancreas using $T_2$-weighted SE sequences, however, such difficulties were not encountered with FLASH. With FLASH MR, the liver, muscular structures and pancreas were outlined by a low SI line which is related to magnetic susceptibility artifact. This edge darkening has been described and is more prominent on $T_1$-weighted FLASH sequences. Artifact related to vascular pulsation of the inferior vena cava, aorta and mesenteric vessels was identified and also more prominent on $T_1$-weighted FLASH scans. This degraded image quality and on several examinations made measurement of SI of the pancreas difficult when utilizing $T_1$-weighted FLASH sequences. Motion artifact reduction from several types of physiologic motion has been reviewed in the literature. In addition, vascular artifact may be overcome by using a modification of FLASH called systemic saturation FLASH. There was no attempt to reduce vascular artifact in this study.

Post Stimulation

Figure 2A:
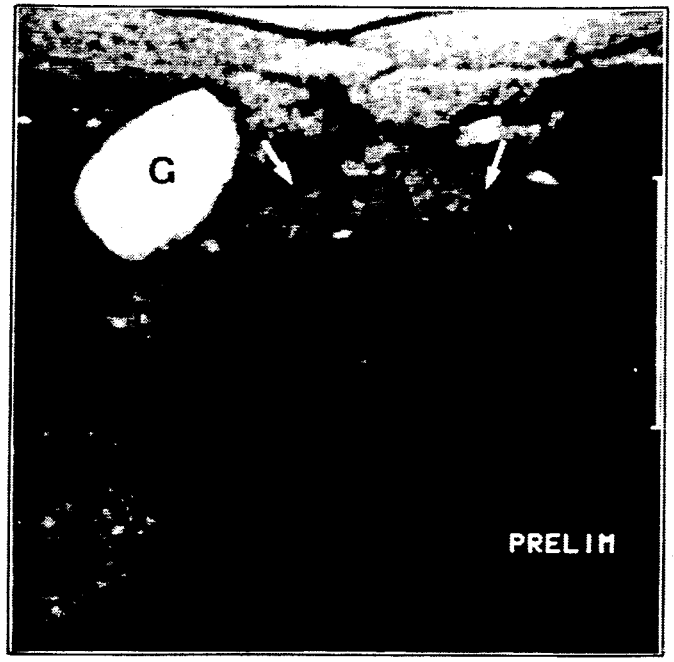
FIG. 2(a) is a preliminary fasting $T_2^*$-weighted FLASH image of the neck and portions of the body of the pancreas (arrows).
Figure 2B:
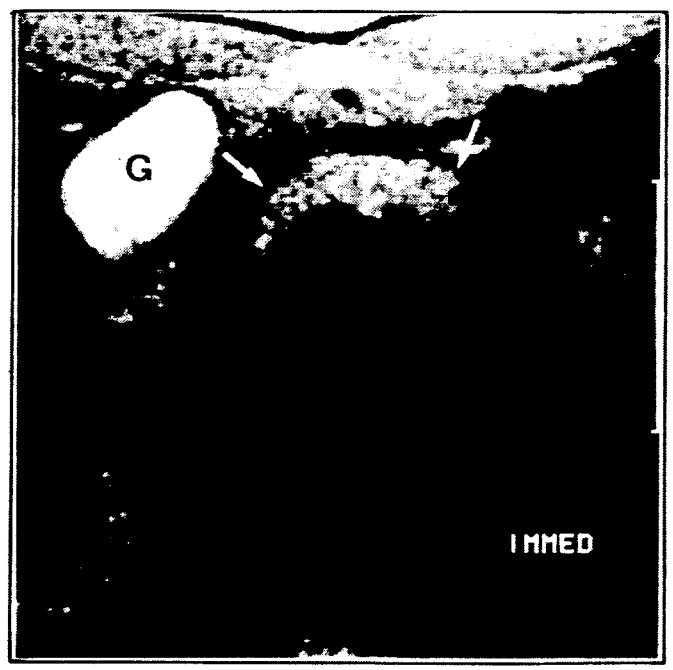
FIG. 2(b) is a $T_2^*$-weighted FLASH image of the neck and portions of the body of the pancreas and shows how pancreatic SI is higher immediately following secretin injection. Little to no change is seen in the region of the duodenum (D). Identical window settings and photographic exposure factors were used in a and b.

In four of the six volunteers, $T_2^*$-weighted FLASH sequences demonstrated a mean % increase of the relative SI of the pancreas of $4.6+1.9$ (1=STD) immediately following the secretin bolus termination (FIG. 2); the other two showed a decrease of SI at the onset of scanning. This rise was transient and was followed by a gradual decline of SI in all six subjects, the mean being $11.6\pm6.4$ (1-STD) at 20 min's post injection. The mean percentage change of the relative pancreatic SI on the $T_2^*$-weighted images at various time intervals is shown along with control and p-values in Table 2 as follows:

TABLE 2

|  | Control (+ 1-STD) | Secretin (+ 1-STD) | P-value |
| --- | --- | --- | --- |
| Immediate | −1.1 ± 4.2 | +9.1 ± 6.6 | 0.76 |
| 5-min | +1.6 ± 3.5 | −10.7 ± 8.0 | 0.02 |
| 7-min | +3.1 ± 8.8 | −7.4 ± 5.7 | 0.08 |
| 12-min | −0.8 ± 1.9 | −8.3 ± 5.9 | 0.04 |
| 20-min | +1.6 ± 4.8 | −11.6 ± 6.4 | 0.003 |

Figure 3:
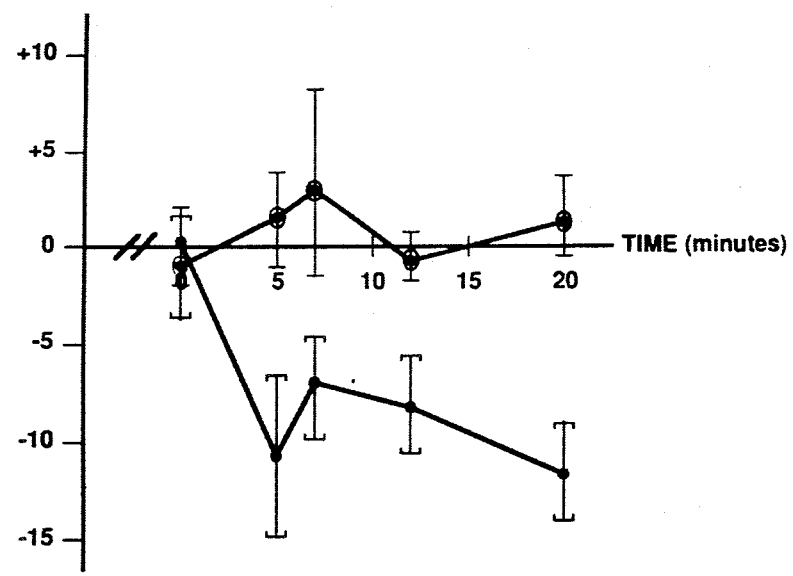
FIG. 3 is a graphical representation showing the percent change of the relative pancreatic SI as observed from $T_2^*$-weighted FLASH images at various time intervals following intravenous administration of secretin and after intravenous injection of saline as a control. The bars depict one standard error of the mean above and below the mean at various times. Time (O) is immediately after secretin or saline injection. The percent change of SI's are relative to baseline fasting values.
Figure 4A:
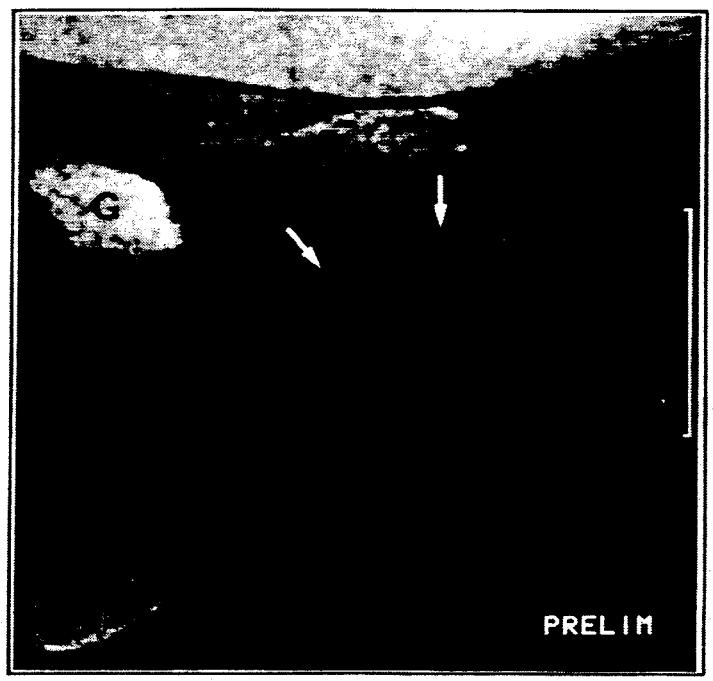
FIGS. 4(a) and (b) show FLASH $T_2^*$-weighted images of the pancreatic body (arrows), before, (FIG. 4(a)), and 20-minutes after secretin bolus injection, (FIG. (b)). The pancreatic SI is lower in (FIG. (b)) and there is marked distention of the duodenum (D), with fluid secreted by the pancreas. Identical window settings and photographic exposure factors were used in FIGS. 4(a) and (b).
Figure 4B:
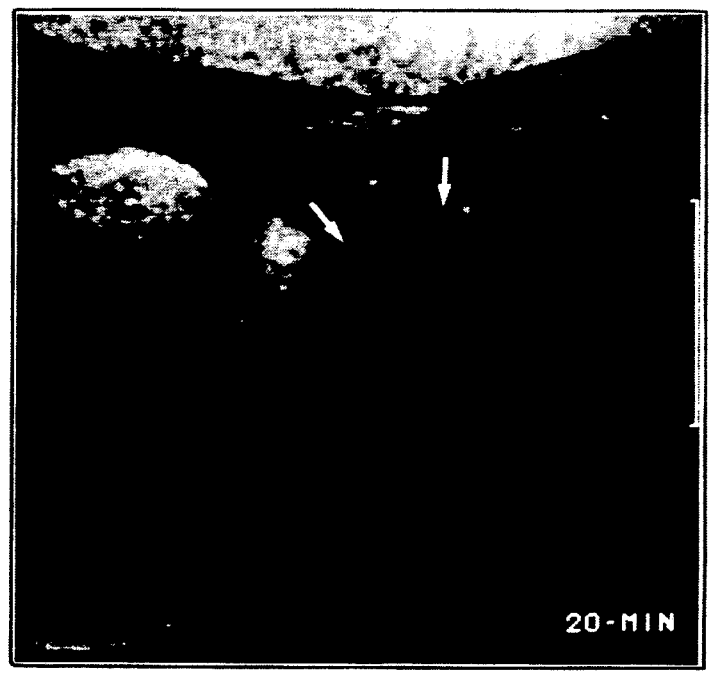

This is also displayed as time response curves in FIG. 3. The SI drop was visually apparent as shown in FIG. 4 as was significant duodenal distention from fluid secreted by the pancreas.

Figure 5:
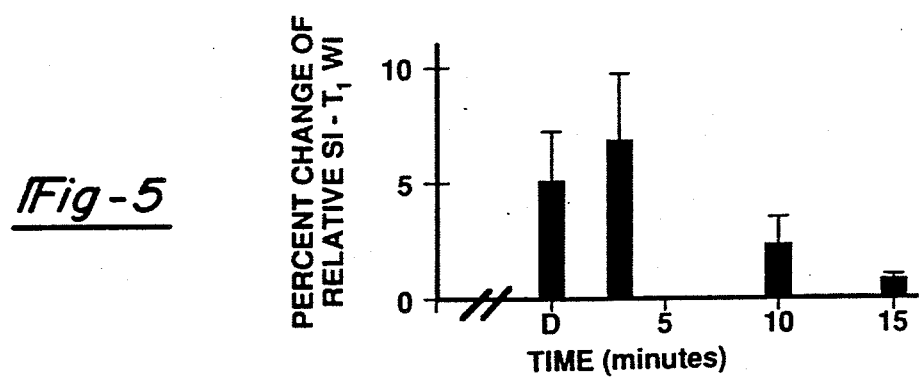
FIG. 5 is a graphical representation showing changes of the relative pancreatic SI as measured from $T_1$-weighted FLASH sequences over time. Bars denote 1-standard error of the mean.

$T_1$-weighted FLASH MRI demonstrated a mean % rise of the relative SI of $5.08\pm2.13$ (1-STD) during the injection process and $6.80\pm2.83$ (1-STD) at 3 minutes after secretin injection. Values are shown in the form of a bar graph in FIG. 5 and in Table 3 as follows:

TABLE 3

| TIME (minutes) | MEAN PERCENT CHANGE OF RELATIVE SI - $T_1$ WI |
| --- | --- |
| D | 5.08 ± 2.13 |
| 3 | 6.80 ± 2.83 |
| 10 | 2.23 ± 0.76 |
| 15 | 0.71 ± 0.29 |

There were no adverse effects to administering secretin; approximately half experienced a mild transient epigastric discomfort.

METHOD OF IMAGING

According to the invention, secretin which is commercially available as porcine, is administered in solution form, intravenously to the patient. Optimal concentrations are 2 clinincal units per kilogram of body weight, taken from a stock solution of 10 clinical units per cc of Normal saline. The diluent and lyophilized secretin can be in kit form with two bottles of 70-80 CU of secretin. The secretin may be recombinent human, bovine, and porcine, and bovine and porcine; with the preferred embodiment being porcine.

A base line study is needed before the secretin solution is administered when one is interested in determining pancreatic exocrine dysfunction. A dose from secretin stock solution is measured according to optimal concentration (above) and the secretin solution is administered intravenously as a bolus injection over 1-minute to the patient. The secretin solution reaches and begins to affect pancreatic tissue immediately after injection. In order to achieve optimal response, images are obtained during a time period ranging from 1 to 30 minutes following injection.

The MRI examination is carried out in a known manner with respect to the particular purpose of the examination. Serial fast scans utilizing rapid imaging techniques may be used to assess the physiological response of the pancreas over time. In addition, post secretin injection sequences will be selected to maximize signal intensity changes of the normal pancreas relative to pancreatic tumors or other masses on $T_1$ or $T_2$-weighted images. Pancreatic imaging can be accomplished in an efficient manner using a surface coil.

It should be apparent to one having ordinary skill in the art that many modifications or changes can be made to the preferred embodiment without departing from the spirit of the present invention as expressed in the scope of the appended claims.

I claim:

1. A method of magnetic resonance imaging of the pancreas in a patient comprising the steps of:
    administering a predetermined dose from a stock solution containing one of a group comprised of recombinant human secretin, recombinant porcine secretin, recombinant bovine secretin, natural bovine, and natural porcine secretin;
    waiting a predetermined period of time in the range of one to thirty minutes to permit distribution of the solution throughout the patient;
    subjecting the pancreas to magnetic resonance imaging by a magnetic resonance imaging machine having at least a 1 T magnet within said predetermined period of time; and
    observing a $T_2$-weighted image to produce an image of the pancreas.

2. The method of magnetic resonance imaging as set forth in claim 1 further comprising before said administering step, the step of determining a base line image of said patient.

3. The method of magnetic resonance imaging of claim 1 wherein said predetermined dose is administered having a ratio of 2 clinical units per kilogram of body weight of the patient.

* * * * *